United States Patent [19]

Ott

[11] B 4,006,367

[45] Feb. 1, 1977

[54] SOLID STATE ALTERNATING CURRENT SWITCHING DEVICE

[75] Inventor: Eduard Karl Ott, Bothell, Wash.

[73] Assignee: Frontier Machinery Company, Walla Walla, Wash.

[22] Filed: Nov. 13, 1974

[21] Appl. No.: 523,226

[44] Published under the second Trial Voluntary Protest Program on March 23, 1976 as document No. B 523,226.

[52] U.S. Cl. .................. 307/252 B; 307/252 Q
[51] Int. Cl.² ..................... H03K 17/60
[58] Field of Search ............. 307/252 B, 252 Q

[56] References Cited

UNITED STATES PATENTS

| 3,226,625 | 12/1965 | Diebold | 307/252 Q |
| 3,421,063 | 1/1969 | Reinke | 307/252 B |
| 3,543,051 | 11/1970 | Potter | 307/252 B |

OTHER PUBLICATIONS

"Motor Start Switch", by Marckel, IBM Technical Discl. Bulletin, vol. 14, No. 6, Nov. 1971, pp. 1942, 1943.

"Triac AC Contactor", by Farel et al., I.B.M. Tech. Discl. Bulletin, vol. 13, No. 8, Jan. 1971, pp. 2277.

*Primary Examiner*—Harold A. Dixon
*Attorney, Agent, or Firm*—Wells, St. John & Roberts

[57] ABSTRACT

A solid state alternating current switching device is described having a pair of series connected triacs in which the individual breakover voltages of the triacs are less than the peak line voltage and the sum of the individual breakover voltages is greater than the peak line voltage. An isolated circuit directly interconnects the gate terminals of the triacs to selectively bleed an internal triac gate current through the circuit to trigger the triacs to their conductive states.

7 Claims, 4 Drawing Figures

SOLID STATE ALTERNATING CURRENT SWITCHING DEVICE

BACKGROUND OF THE INVENTION

This invention relates to solid state switching devices and more particularly to triac solid state switching devices.

The term "triac" is a generic term that has been coined to identify a bi-directional three terminal multilayer semiconductor device which is triggered into conduction by a gate signal (positive or negative) applied to the gate electrode or terminal. Triacs have been used rather extensively for switching of AC power circuits having voltages of up to 240 volts (RMS). Although it is apparently possible to construct triacs that are capable of controlling AC power above 240 volts (RMS), their cost of manufacture increases rapidly, almost exponentially with line voltage.

Generally a triac is triggered from a nonconductive state to a conductive state with the application of a small amount of current either negative or positive applied to the gate terminal. Consequently, rather complicated and elaborate circuits must be devised to make sure that the external signal current applied to the gate terminal is not a transient signal but represents the desired triggering signal. Generally the circuits are devised utilizing either a separate control circuit source for applying the necessary gate current to trigger the triac or a shunt circuit from the applied power line to trigger the triac.

In order for a triac to effectively control the switching it is necessary that the breakover voltage of the triac be higher than the peak voltage applied across the triac. The prior art indicates that a gate current of a specified amplitude of either polarity will trigger the triac into conduction provided that the applied peak voltage is less than the breakover voltage of the triac. If the breakover voltage is exceeded, even transiently, the triac will switch to the conducting state and remain conducting until the current drops below a holding current value. Frequently the turning on of the triac by a transient voltage has extremely undesirable hazardous consequences to the circuit being controlled. Either a circuit must be designed that has a system for transient suppression or the triac itself must be designed so that the triac breakover voltage substantially exceeds the designed peak voltage of the system.

Triacs are commercially available having breakover voltages approaching 500 volts. However, such triacs are unacceptable for use in high voltage alternating power circuits such as 480 volts (RMS) which have peak voltages approaching 700 volts. Consequently, use of a triac rated at 500 volts would be unacceptable for use in controlling or switching a 480 volt (RMS) power circuit.

Triacs that are capable of handling 480 volts (RMS) are many fold more expensive than triacs that are able to switch 240 volt power circuits.

One of the principal objects of this invention is to provide a solid state alternating current switching device utilizing triacs in such a configuration that the use of an external gate current is not required to trigger the triacs into conduction.

An additional object of this invention is to provide a solid state switching device utilizing triacs in which one is able to utilize the device for controlling a high voltage system having a peak voltage that is greater than the breakover voltage of any one of the triacs.

A further object of this invention is to provide a triac solid state switching device having an isolated triggering circuit requiring no external power source to trigger the device into conduction.

A further object of this invention is to provide a high voltage solid state switching device that is extremely reliable and yet inexpensive to manufacture.

A further object of this device is to provide a low cost solid state switching device capable of handling high voltage and high current requirements.

An additional object of this invention is to provide a low cost solid state switching device capable of controlling a high voltage alternating current circuit in which switching is accomplished at or near zero value line voltage.

A still further object of this invention is to provide a solid state power switching device that may be manufactured for a very low cost to reliably switch a high voltage electrical motor operating on 480 volts (RMS).

These and other objects and advantages of this invention will become apparent upon the reading of the following detailed description of preferred and alternate embodiments.

BRIEF DESCRIPTION OF THE DRAWING

A preferred and alternate embodiment are illustrated in the accompanying drawing, in which.

DETAILED DESCRIPTION OF PREFERRED AND ALTERNATE EMBODIMENTS

Figure 1:
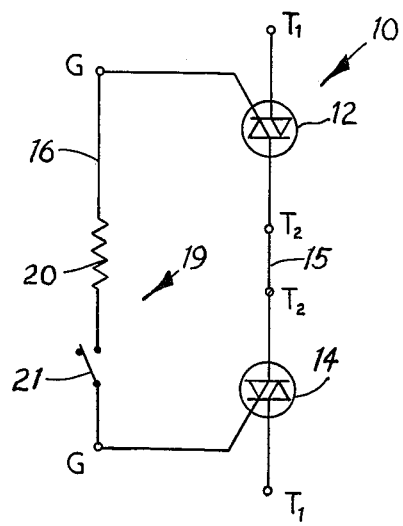
FIG. 1 is an electrical schematic diagram of a solid state alternating current switching device illustrating principal aspects of this invention.

Referring now in detail to the drawing, there is illustrated in FIG. 1 a solid state alternating current switching device 10 for switching an alternating current circuit. The device 10 includes a first triac 12 having a main terminal identified as $T_1$ a main terminal identified as $T_2$ and a gate terminal identified by the capital letter G. The gate terminal G is positioned on the same side as main terminal $T_1$. As previously mentioned a triac is essentially a bi-directional three terminal multilayer semiconductor device which is normally triggered into conduction by the application of a low energy positive or negative gate current to change the triac from a nonconducting or blocking state to a conducting state. The triac 12 has a predetermined breakover voltage. In a preferred embodiment the predetermined breakover voltage of the triac 12 is less than peak line voltage applied to the device 10.

The device 10 further includes a second triac 14 having a main terminal $T_1$, a main terminal $T_2$ and a gate terminal G. Likewise the triac 12 has a predetermined breakover voltage In a preferred embodiment, the predetermined breakover voltage of the triac 14 is less than the peak voltage applied to the device 10. The triac 12 and 14 are connected in series. In the preferred embodiment illustrated in FIG. 1, the main terminals $T_2$ of the triacs 12 and 14 are electrically connected together by a series terminal coupling or connector 15. For purposes of illustration only, triac 12 and 14 may be said to be mounted in series in a front-to-front relationship with terminals $T_2$ interconnected. It has been found that when the triacs are mounted with the main terminals $T_2$ interconnected then the effective breakover voltage of the device 10 is equal to the sum of the individual breakover voltages of the triacs 12 and 14. For example, if the predetermined breakover voltage of the triac 12 is 460 volts and the breakover voltage of triac 14 is 510 volts, then the effective breakover voltage of switching device 10 is approximately 970 volts. Even though the individual triac 12 and 14 would not be satisfactory for use in switching a 480 volt (RMS) AC network, it has been found that the triacs 12 and 14 when placed in series with the main terminals $T_2$ interconnected are capable of effectively switching a 480 volt (RMS) AC circuit across the terminals $T_1$.

The device 10 incudes an isolated gate circuit 16 that directly interconnects gate terminals G of triac 12 and 14. The term "isolated" is utilized to indicate that the circuit interconnects the triacs 12 and 14 without any outside or external voltage or current being applied thereto from an alternate source or as a shunt from the applied voltage. The isolated circuit 16 includes a current conducting means 19 for selectively permitting an internal triac gate current to be conducted through the circuit 16 between the gate terminals G to trigger or change the triacs from their nonconductive states to their conductive states.

It appears that the isolated circuit 16 is able to conduct a triac bleed current internally through the triacs 12 and 14 to serve as a triggering current for the triacs so that an external signal whether negative or positive need not be used to trigger the device 10 to a conductive state. The conducting means 19 has a multimode impedance means 21 having at least a first mode having a high impedance of sufficient magnitude to prevent the internal triac gate current from being conducted between the gate terminals G and a second mode having a sufficiently low impedance to permit the internal triac gate current to be conducted between the gate terminals G to trigger the triac from their nonconductive states to their conductive states. Various types of multimode impedance means may be utilized to accomplish the intended objects. As illustrated in FIG. 1 the multimode impedance means 21 may be a mechanically operated switch. Alternatively relay contacts may be used in which the contacts have a very high impedance when the contacts are open to prevent any triac gate current from flowing between the gate terminals and a very low impedance to permit the gate current to be conducted between the gate current terminals G when the contacts are closed. Various types of multimode impedance means 21 may be utilized in such a system such as transistors, phototransistors, hall effect switches, mechanical switches, relay contacts, etc. The multimode impedance means 21 may be operated by a mechanical, magnetic, optical, or electrical control system.

Additionally the conducting means 19 includes a fixed impedance element 20 for limiting the magnitude of the internal triac gate current that may be conducted through the circuit 16 between the gate terminals G. If a too high gate current flows through the isolated circuit 16, the gate terminals G may become overheated and damage the terminal connection with the semiconductor material.

For many applications it is desirable to place the device 10 in its conductive state when the magnitude of the AC voltage applied to the device 10 is near zero. Such a feature is particularly desirable to prevent contact arcing and to increase the useful lives of transformers and motors that may be part of the network. When zero or near zero switching is desired, then the impedance of element 20 should be selected having a value sufficiently low to permit internal gate current to be conducted through circuit 16 at or near zero applied voltage yet limit the magnitude of the gate current to prevent gate terminal heat damage.

The optimum impedance value for the element 20 will depend upon the construction of the triac and its electrical characteristics, the applied voltage and current characteristics of the network in which the device 10 is used. As shown in FIG. 1 the element 20 is preferably a resistor. For one 480 volt (RMS) application, the applicant has found that a resistor having a resistance value of approximately 2,000 ohms is satisfactory to limit the gate current bled from the triacs while enabling the triac to be triggered to the conductive stage at or near zero applied voltage value.

In partial summary, it can be said that the device 10 may be triggered without any external signal, whether negative or positive, applied to the triac gate terminals. The device 10 may be triggered by merely placing the multimode impedance means 21 of the isolated circuit 16 in the conductive mode.

Figure 2:
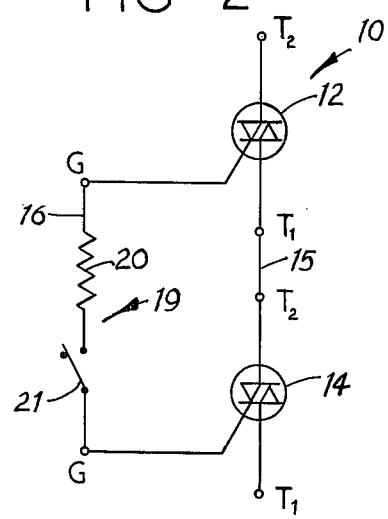
FIG. 2 is an electrical schematic diagram showing an alternate embodiment of this invention.

The alternate embodiment illustrated in FIG. 2 shows the triacs 12 and 14 mounted in series with terminal $T_1$ of triac 12 coupled in series with terminal $T_2$ of triac 14. The alternate embodiment shown in FIG. 2 has the same voltage blocking protection as the embodiment shown in FIG. 1, namely that the affective breakover voltage of the device is the sum of the individual breakover voltages of each of the triacs. However, the alternte embodiment shown in FIG. 2 has the unusual feature of only conducting current through the circuit 16 when the applied voltage exceeds the individual breakover voltage for either of the triacs 12 or 14. The alternate embodiment shown in FIG. 2 does not have the zero voltage switching capability. For example, assuming that the breakover voltage for triac 12 is 460 volts and the breakover voltage for triac 14 is 510 volts, so that the combined protective voltage capability of the device is 970 volts. When the multimode impedance means 21 is positioned in the conductive state (with the switch closed), the triac bleed gate current will not flow through the circuit 16 to trigger the device 10 until the applied voltage across the device 10 exceeds 460 volts.

Figure 3:
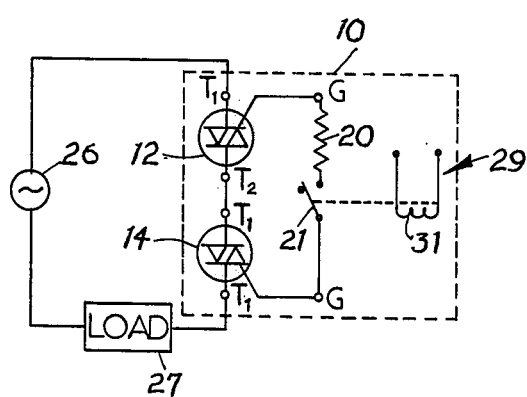
FIG. 3 is an electrical schematic diagram illustrating the solid state switching device mounted in an alternating current network.

FIG. 3 illustrates an alternate embodiment with an alternating current network having an alternating current source 26 connected through the device 10 to a load 27. The multiimpedance means 21 is operated through a control means 29 to place the multimode impedance means 21 in the conductive mode to trigger the triacs 12 and 14 to apply AC voltage to the load 27. Various types of control means 29 may be utilized such as a relay 31. Light illuminating diodes may be utilized in conjunction with phototransistors or photo sensing switches. It should be noted that the control means 29 is electrically isolated from the circuit 16 so that any transient signal in the control circuit will not be applied to the gate terminals G.

Figure 4:
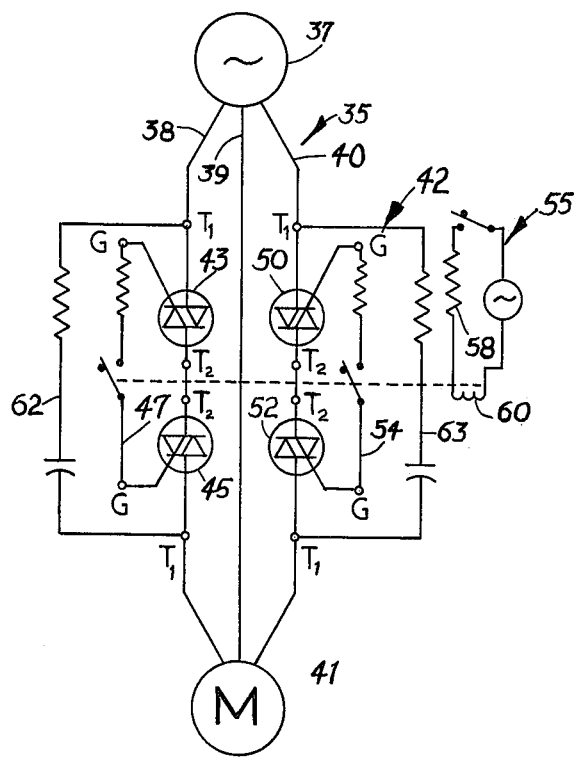
FIG. 4 shows an electrical schematic diagram of an alternate embodiment of this invention in which a switching device is utilized in a three phase alternating current system for supplying power to an electrical motor.

FIG. 4 shows an additional embodiment for use in a three phase power system 35. System 35 includes a three phase generator or source 37 having at least three lines 38, 39, and 40. The generator 37 supplies high voltage AC current for driving a motor 41 (inductive load). A solid state switching device 42 of the present invention is utilized for controlling or switching the high voltage AC current to the motor to turn the motor off and on. In this embodiment the solid state switching device 42 includes a pair of triacs 43, 45 mounted in series (front-to-front) in line 38 with the gate terminals G of the triacs 43 and 45 being connected through an isolated circuit 47. The device 42 further includes a second pair of triacs 50 and 52 that are connected in series (front-to-front) in line 39. An isolated circuit 54 interconnects the gate terminals G of the triacs 50 and 52.

A third pair of triacs may optionally be utilized in line 40. However, it is not necessary since the third line may be utilized as a reference or ground. System 35 shows a control circuit 55 which is electrically isolated from the gate circuits 47 and 54.

The present application illustrated in FIG. 4 is particularly useful in switching high voltage such as 480 volts (RMS) AC from the source 37 to the motor 41. Generally the control circuit 55 would be operated at a lower voltage such as 115 volts AC or 12 to 24 volts DC. An impedance element 58 is placed in the control circuit 55. In the particular embodiment illustrated a relay 60 is mounted in the control circuit with the relay contacts being positioned in the isolated gate circuits 47 and 54 to serve as the multimode impedance means 21.

When the solid state switching device 42 is utilized in an inductive load circuit, it is desirable to utilize filter circuits 62 and 63 in parallel with the pairs of triacs 43, 45, 50 and 52 respectively. In an inductive circuit, the current lags the voltage and reaches zero subsequent to the voltage had reached a value in the opposite polarity. Since the triac tries to open at current zero, the instantaneous line voltage appears across the triac at a rate limited only by the stray capacitance and the capacitance of the triac. For the triac to turn off reliably in this kind of circuit it is desirable to utilize the filter circuit 62 and 63 to limit the rate of voltage rise (commutation dv/dt).

Each of the filter circuits 62 and 63 includes a resistor 74 and capacitor 65 to limit the communtation dv/dt to an acceptable value. The values of the resistor and capacitor 64 and 65 respectively may be selected depending upon the particular circuit and applied voltages and load currents.

It should be noted that in such a system (FIG. 4), one can utilize triacs 43, 45, 50 and 52 having individual breakover voltages less than the peak voltage of the generator 47. For example, triac 43, 45, 50 and 52 may have individual breakover voltages of 400–500 volts and still be able to control 480 volt (RMS), 700 peak volts AC power circuit. Such triacs cost considerably less than triacs having rated capacities of 800–1,000 volts. Additionally, the semiconductor device 42 may be triggered to its conductive state at approximately zero line voltage without the use of an external triggering gate signal.

It should be understood that various other modifications may be made to the disclosed embodiments of this invention, as well as, alternate embodiments may be provided, without departing from the spirt and scope of this invention as defined by the following claims.

I claim:
1. A solid state alternating current three phase power switching device for controlling a network between a three phase alternating current source having a predetermined peak voltage and a motor in which the network has a power line for each phase, comprising:
   pairs of series directly connected triacs mounted in at least two of the three power lines;
   each triac having a nonconducting state and a conducting state;
   wherein each triac has an individual breakover voltage less than the source peak voltage;
   wherein the sum of the breakover voltage of the triacs exceeds the source peak voltage;
   each triac having a gate terminal;
   isolated circuits interconnecting the gate terminals of each pair of triacs; and
   each circuit having conductive means for permitting a triac gate current to be conducted through the circuit between the gate terminals to change the pair of triacs from their nonconductive states to their conducting states to apply the source alternating current to the motor.

2. The solid state switching device as defined in claim 1 further comprising
   a control means operatively connected to the conducting means of each isolated circuit to selectively activate the conducting means.

3. The solid state switching device as defined in claim 2 wherein the conducting means includes relay contacts mounted in the isolated circuits and wherein the control means includes a relay operatively connected to the relay contacts for closing the isolated circuits in response to the operation of the relay.

4. The solid state switching device as defined in claim 1 wherein the conductive means for selectively permitting the triac gate current to be conducted through the circuit includes a multimode impedance means with; (1) a first mode having a high impedance of sufficient magnitude to prevent the gate current from being conducted between the gate terminals; and (2) a second mode having a low impedance of sufficient magnitude to permit the internal triac gate current to be conducted between the gate terminals to change the triacs from their nonconducting states to their conducting states.

5. The solid state switching device as defined in claim 1 further comprising filter circuits mounted parallel with the pairs of triacs to limit the rate of voltage rise impressed on the triacs when the triacs change from their conducting state to their nonconducting state.

6. The solid state switching device as defined in claim 1 wherein the circuit has an impedance element with a substantially fixed impedance value mounted therein to limit the magnitude of the gate current conducted through the circuit between the gate terminals to prevent gate terminals overheating.

7. The solid state switching device as defined in claim 6 wherein the impedance element is a resistor.

* * * * *